(12) United States Patent
Lucas et al.

(10) Patent No.: US 8,370,773 B2
(45) Date of Patent: Feb. 5, 2013

(54) METHOD AND APPARATUS FOR DESIGNING AN INTEGRATED CIRCUIT USING INVERSE LITHOGRAPHY TECHNOLOGY

(75) Inventors: Kevin Dean Lucas, Meylan (FR); Robert Elliott Boone, Austin, TX (US); Yves Rody, Eindhoven (NL)

(73) Assignees: Freescale Semiconductor, Inc., Austin, TX (US); Koninklijke Philips Electronics N.V., Eindhoven (NL)

( * ) Notice: Subject to any disclaimer, the term of this patent is extended or adjusted under 35 U.S.C. 154(b) by 429 days.

(21) Appl. No.: 12/377,664

(22) PCT Filed: Aug. 16, 2006

(86) PCT No.: PCT/IB2006/003053
§ 371 (c)(1),
(2), (4) Date: Aug. 3, 2010

(87) PCT Pub. No.: WO2008/020265
PCT Pub. Date: Feb. 21, 2008

(65) Prior Publication Data
US 2010/0333048 A1    Dec. 30, 2010

(51) Int. Cl.
*G06F 17/50*    (2006.01)
(52) U.S. Cl. ................. 716/54; 716/52; 716/53
(58) Field of Classification Search .......... 716/52–54
See application file for complete search history.

(56) References Cited

U.S. PATENT DOCUMENTS

| | | |
|---|---|---|
| 5,326,659 A | 7/1994 | Liu et al. |
| 5,705,301 A | 1/1998 | Garza et al. |
| 6,077,310 A | 6/2000 | Yamamoto et al. |
| 6,081,658 A | 6/2000 | Rieger et al. |
| 6,214,494 B1 | 4/2001 | Bula et al. |
| 6,584,609 B1 | 6/2003 | Pierrat et al. |
| 6,665,856 B1 | 12/2003 | Pierrat et al. |
| 6,720,565 B2 | 4/2004 | Innes et al. |
| 6,765,651 B1 | 7/2004 | Fiekowsky et al. |
| 6,912,323 B2 | 6/2005 | Copeland et al. |
| 6,978,438 B1 | 12/2005 | Capodieci |
| 7,010,776 B2 | 3/2006 | Gallatin et al. |
| 7,085,698 B2 * | 8/2006 | Tsai et al. ................ 703/13 |
| 7,256,910 B2 | 8/2007 | Lee |

(Continued)

FOREIGN PATENT DOCUMENTS

| | | |
|---|---|---|
| EP | 1582934 A | 10/2005 |
| EP | 1584980 A | 10/2005 |

(Continued)

OTHER PUBLICATIONS

Poonawala et al.; "OPC and PSM design using inverse lithography: A non-optimization approach"; SPIE, Feb. 19-24, 2006; pp. 1-14.*

(Continued)

*Primary Examiner* — Naum Levin

(57) ABSTRACT

Method and apparatus for designing an integrated circuit by calculating an optimised reticle layout design from an IC layout design and a model describing an optical system for transferring the IC layout design onto a semiconductor wafer using a reticle, wherein the IC layout design comprises features defined by a plurality of boundaries. Approximating the plurality of boundaries to generate an approximated IC layout design suitable for the manufacture of the IC. Performing OPC simulation on at least a portion of the approximated IC layout design.

19 Claims, 2 Drawing Sheets

U.S. PATENT DOCUMENTS

| | | | |
|---|---|---|---|
| 7,266,480 B2 * | 9/2007 | Adam | 703/2 |
| 7,266,803 B2 | 9/2007 | Chou et al. | |
| 7,298,496 B2 * | 11/2007 | Hill | 356/512 |
| 7,487,489 B2 * | 2/2009 | Granik | 716/51 |
| 7,512,927 B2 | 3/2009 | Gallatin et al. | |
| 7,530,049 B2 * | 5/2009 | Kobayashi et al. | 716/53 |
| 7,562,319 B2 | 7/2009 | Pierrat et al. | |
| 7,747,978 B2 | 6/2010 | Ye et al. | |
| 7,788,630 B2 | 8/2010 | Li et al. | |
| 7,886,262 B2 * | 2/2011 | Chew et al. | 716/132 |
| 2002/0083408 A1 | 6/2002 | Haffner et al. | |
| 2002/0133801 A1 | 9/2002 | Granik et al. | |
| 2002/0188925 A1 | 12/2002 | Higashi | |
| 2003/0140330 A1 | 7/2003 | Tanaka et al. | |
| 2004/0122636 A1 | 6/2004 | Adam | |
| 2005/0055658 A1 | 3/2005 | Mukherjee et al. | |
| 2005/0076321 A1 | 4/2005 | Smith | |
| 2005/0081179 A1 | 4/2005 | Melvin, III | |
| 2005/0185159 A1 | 8/2005 | Rosenbluth et al. | |
| 2006/0269875 A1 * | 11/2006 | Granik | 430/311 |
| 2007/0032896 A1 * | 2/2007 | Ye et al. | 700/108 |
| 2007/0186208 A1 * | 8/2007 | Abrams et al. | 716/21 |
| 2007/0209029 A1 | 9/2007 | Ivonin et al. | |
| 2008/0077907 A1 | 3/2008 | Kulkarni | |
| 2008/0295060 A1 | 11/2008 | Lucas et al. | |
| 2009/0070730 A1 | 3/2009 | Zhang et al. | |
| 2009/0185740 A1 | 7/2009 | Tirapu-Azpiroz et al. | |
| 2009/0193387 A1 | 7/2009 | Mukherjee et al. | |
| 2010/0153904 A1 | 6/2010 | Zhang | |
| 2010/0229147 A1 | 9/2010 | Ye et al. | |

FOREIGN PATENT DOCUMENTS

| | | |
|---|---|---|
| EP | 1329771 B1 | 9/2006 |
| WO | 2005073807 A | 8/2005 |
| WO | 2007048442 A | 5/2007 |

OTHER PUBLICATIONS

Liu et al; "Inverse Lithography Technology Principles in Practice: Unintuitive Patterns" 2005 Proceedings of the SPIE, vol. 5992, pp. 886-893.

Non-Final Office Action mailed Sep. 30, 2010 for U.S. Appl. No. 12/091,695, 11 pages.

Notice of Allowance mailed Feb. 9, 2011 for U.S. Appl. No. 12/091,695, 13 pages.

Word et al., "Enhanced Model-based OPC for 65nm and Below," Proceedings of SPIE, vol. 5567-143, Dec. 6, 2004, pp. 49-58.

* cited by examiner

METHOD AND APPARATUS FOR DESIGNING AN INTEGRATED CIRCUIT USING INVERSE LITHOGRAPHY TECHNOLOGY

CROSS-REFERENCE TO RELATED APPLICATIONS(S)

This application is a national phase entry under 35 U.S.C. §371 of International Application No. PCT/IB2006/003053 filed 16 Aug. 2006.

FIELD OF THE INVENTION

The present invention relates to a method and apparatus for designing an integrated circuit.

BACKGROUND OF THE INVENTION

When making an integrated circuit (which may also be referred to as an IC, chip or device), a design layout of the IC is made using, for example, CAD tools. A reticle or mask is then produced for the IC design layout and then photolithography is used to transfer features from the reticle or mask to a die (integrated circuit semiconductor wafer).

Various techniques are used to reduce the level of defects in the resultant die. Significant causes of defects are due to optical effects (especially diffraction) which distort the image of the reticle on the semiconductor wafer. Resolution enhancement technologies (RET) are used to limit this distortion. However, as the scale of features on an IC reduces so the impact of optical effects increases.

In one particular RET, prior to the production of the reticle, the design layout may be optimised using optical proximity correction (OPC) to create an optimised reticle layout as described in U.S. Pat. No. 5,705,301.

Typically, the OPC process involves identification of features that require optimisation. For instance, a rule based approach may be used to find features exhibiting particular properties, e.g. properties that may result in defects when the feature is transferred to the IC wafer. The distortion of features caused by the subsequent manufacturing process, including optical effects may be simulated by the OPC procedure. This could include simulating the optical distortions and diffraction effects occurring when transferring the IC layout design on to an IC wafer. Defects may be identified in the IC layout design should the simulated result fall outside any predetermined tolerances or fail comparison with any other particular criteria. This identification of features requiring optimisation shall be referred to as OPC simulation and may include the rule based tests and/or the manufacturing simulation steps, which are typically performed in OPC processes.

After OPC simulation any features containing defects may be optimised in order to ensure that defects are removed or their effects minimised. As discussed in U.S. Pat. No. 5,705,301 the OPC optimisation stage may use various techniques and amends the physical design layout in order to avoid optical or process distortions, also known as patterning defects, when features are transferred from the reticle or mask that may cause failures of the final device. Where distortions are found that are likely to cause failures the OPC optimisation process discretizes the design layout into moveable segments and manipulates these segments until the distortions are minimised so that the risk of failures in the resultant chip is reduced.

The success of the optimisation of a particular feature may be tested by a further OPC simulation step and the process may iterate until the defects are corrected or minimised.

The OPC procedure may take several iterations and is time consuming and therefore, costly. However, as the critical dimension (CD) of features incorporated into IC designs decreases OPC optimisation must use rules and models of increasing sophistication requiring ever more powerful computer facilities and longer run times to implement.

One alternative RET is known as inverse lithography technology (ILT) or inverse OPC. Such an approach is described in "Inverse Lithography Technology Principles in Practice: Unintuitive Patterns", Yong Liu, Dan Abrams, Linyong Pang and Andrew Moore, J. Proc. SPIE Vol. 5992, pp 886-893 (2005). Inverse OPC uses a model of the optical system used to transfer the IC design layout onto a semiconductor wafer to create a reticle layout that should form a pattern on the wafer closely matching the layout of the IC layout design itself. In effect, a goal is defined as being the undistorted image and the system is left to run until a pattern is found that would pass through the modelled optical system resulting in a desired image corresponding to the IC design layout or very close to it. Inverse OPC is a highly parallel process which considers large sections of the IC layout design at once.

Inverse OPC can result in reticle layouts that will very accurately produce dies that closely match the required IC layout design. However, inverse OPC can only be used for optimising for optical effects and does not accurately consider other effects such as resist effects, for instance. One major drawback with inverse OPC is that the reticle design that is generated by inverse OPC cannot usually be manufactured successfully due to the complexity or fine structure of the generated reticle designs.

SUMMARY OF THE INVENTION

The present invention provides a method and apparatus for designing an integrated circuit as described in the accompanying claims.

BRIEF DESCRIPTION OF THE FIGURES

The present invention may be put into practice in a number of ways and an embodiment will now be described by way of example only and with reference to the accompanying drawings, in which.

It should be noted that the figures are illustrated for simplicity and are not necessarily drawn to scale.

DETAILED DESCRIPTION OF AN EMBODIMENT

Figure 1:
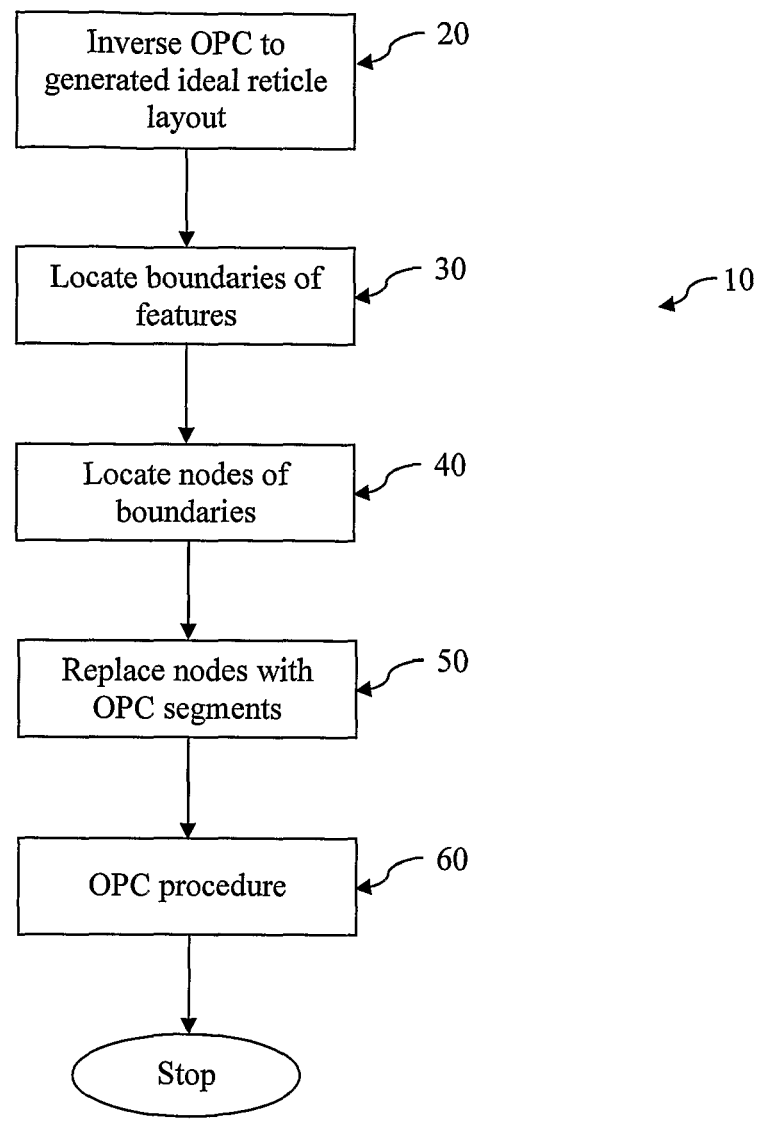
FIG. 1 shows a flowchart of a method for designing an integrated circuit according to an embodiment of the present invention.

FIG. 1 shows a flowchart 10 showing the steps for designing an IC. An IC layout design together with a model describing an optical system used to transfer the IC layout design onto a semiconductor wafer is used to calculate an ideal reticle layout design. This process uses a suitable inverse OPC procedure 20 such as one described in J. Proc. SPIE Vol. 5992, pp 886-893 (2005) mentioned previously. The resulting ideal reticle layout design is analysed to located the boundaries of its features 30. Typically, the features contain details that cannot be manufactured because, for instance, they are too complex or too small. Once the boundaries of the features are found nodes or peaks in the boundaries are located 40. Then, these located nodes are replaced or approximated 50 with segments that are similar in size and/or shape to segments added to an IC layout design during an OPC procedure. This simplifies the reticle layout design. In particular, these segments should be manufacturable on a reticle and subsequent IC wafer.

The simplified reticle layout design may be used as the starting point for an OPC procedure 60. This OPC procedure 60 may be OPC simulation or OPC optimisation or both. The nodes located on the boundaries of the features become the segments used to optimise features within the IC layout design when the OPC procedure is executed. In this way the OPC procedure does not need to generate all required segments but has instead a more advanced starting point having segments in at least approximated positions. A reticle may then be manufactured and used to create a semiconductor die.

Figure 2:
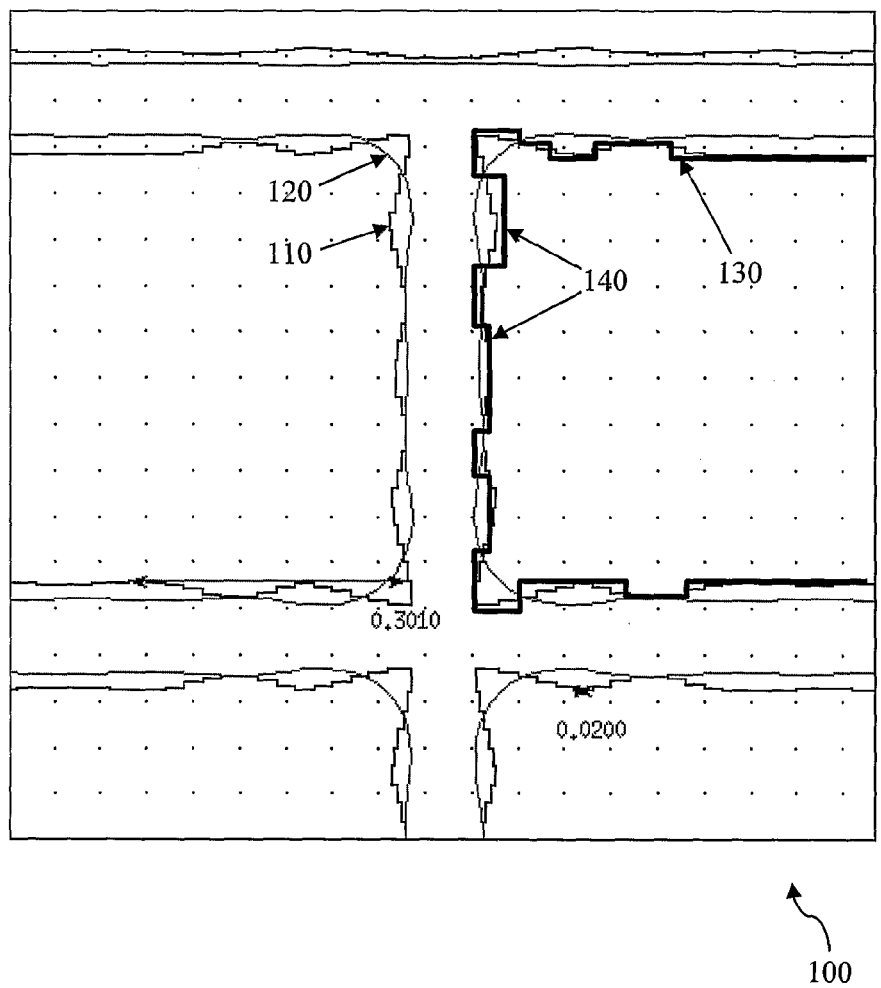
FIG. 2 shows a reticle layout design generated by an embodiment of the present invention, given by way of example.

FIG. 2 shows a reticle layout design 100 formed during various steps of the method described with reference to FIG. 1.

Line 110 defines the boundary of a feature of the reticle layout design after the inverse OPC procedure 20 has completed and can be seen as comprising a plurality of small discrete steps. The finest features, i.e. the steps of this boundary may be too small to be reliably manufactured.

Line 120 defines the theoretical structure of a wafer die that could be formed from a reticle having the structure defined by line 110 should such a reticle be manufacturable. The form of line 120 is calculated during the inverse OPC procedure. However, this theoretical structure only takes into account optical effects. Obviously, this calculation is theoretical as it is unlikely that such a reticle could be manufactured using current technology due to the complex nature of the required reticle layout and the small steps that make up line 110.

Nodes 140 of line 110 are identified by one or more of several techniques such as using the maximum local difference between the theoretical structure and the initial design layout as the centre of a node, or using the points on the theoretical structure with highest local slope as the endpoints of a node. The nodes 140 are approximated and replaced with simpler segments 150 having lower complexity compared with line 110. This results in the simplified structure shown as line 130. For instance, the segments 150 may be simple rectangular shapes which are parallel to the initial design layout, whereas the nodes 140 comprise more complex shapes having more edges.

Although line 130 defines a simplified structure at least some of the benefits of the inverse OPC procedure are retained leading to a wafer die having a structure closer to the ideal yet being formed from a manufacturable reticle having fewer angled edges. These benefits may not be possible from carrying out an OPC procedure alone and may include the generation of unintuitive structures that cannot be generated from either a rule based or model based OPC procedure.

As described with regards to FIG. 1, the simplified structure defined by line 130 may be used as the input to an OPC procedure in order to further reduce the risk of defects occurring on the resultant wafer die. When OPC is carried out alone using the initial IC layout design as a starting point the preferred locations of the moveable segments is unknown. Consequently, several iterations may be required before the preferred or optimum locations are found or an acceptably accurate location may not be found. Performing the method described with regards to FIG. 1 prior to performing OPC, provides the OPC procedure with a more accurate initial estimate as to the optimum locations of the segments and so may reduce the risk of defects and reduce the number of iterations required and therefore, the total execution time.

Furthermore, the rules or models used by the OPC procedure may be limited to those used to correct for non-optical effects with the bulk of the work already carried out by the inverse OPC procedure. Also, inverse OPC is better suited than OPC to correct for optical interference effects with higher coherence light sources which cause waviness or ringing in the resulting wafer pattern. To compensate for optical interference effects requires high accuracy placement of the moveable segments in the mask layout. Inverse OPC automatically calculates the optimum mask layout to correct for these interference effects. Traditional iterative OPC is not capable of this as the optimum position for a moveable segment changes at each iteration.

It may be advantageous to restrict the resources required to design and test the IC layout design. For instance, certain regions of the IC layout design may consist of lower complexity features that are less likely to contain defects. This may also be the case where complex features are repeated many times so that if any potential defects are not removed there is a higher risk that defects will be found in the device.

In a further embodiment of the method of the present invention the method 10 described above is carried out on particular individual regions of a IC layout design and the remaining regions are excluded from this treatment. The particular individual regions chosen may depend on several factors. For instance, lower complexity regions such as those dedicated for logic functions (and so containing few repeated structures) may be ignored. Higher complexity regions such as those dedicated to memory functions (and so containing many repeated structures) may be subjected to the method 10 described above. Feature complexity can be calculated using measurements of minimum feature dimensions, using counts of feature vertices or other geometric methods.

Alternative ways of determining which regions to treat in this way include defining regions during the design stage (either manually or automatically), or applying other rule based criteria such as determining the feature density of each region and excluding lower density regions from further treatment.

As a further alternative certain aspects of the method 10 described above may be excluded from particular regions of the IC layout design rather than excluding the entire method. For instance, the inverse OPC step may be included but the OPC procedure 60 (including simulation and/or optimisation steps) may be excluded.

The method described above may be carried out in an automated manner using suitable apparatus or a computer programmed to perform each of the method steps.

As will be appreciated by the skilled person, details of the above embodiment may be varied without departing from the scope of the present invention, as defined by the appended claims.

For example, the nodes of the border defined by line 110 may be found by simulated image light intensity maxima, minima or gradient calculations to identify the major positive and negative modulations of the image such as are commonly performed in signal processing or optical engineering applications.

It will be appreciated that the additional embodiment of excluding certain regions from further analysis based on each regions' complexity is not restricted to the method 10 described above. For instance, other forms of defect identification or optimisation methods may be restricted to particular regions based on complexity or structure in a similar way.

The invention claimed is:

1. A method of designing an integrated circuit, IC, comprising the steps of:
   performing inverse optical proximity correction (OPC), using a computer, to generate an optimized reticle layout design from an IC layout design and a model describing an optical system for transferring the IC layout design onto a semiconductor wafer using a reticle, wherein the optimized reticle layout design comprises features defined by a plurality of boundaries;
   approximating the plurality of boundaries to generate an approximated reticle layout design suitable for the manufacture of the IC; and
   performing OPC simulation on at least a portion of the approximated reticle layout design in order to identify feature defects.

2. The method of claim 1, wherein the approximating step further comprises the step of:
   identifying nodes in the plurality of boundaries.

3. The method of claim 2, wherein the approximating step further comprises the steps of:
   replacing each node with a discrete segment.

4. The method of claim 3 further comprising the step of performing OPC optimization using the approximated IC layout design.

5. The method of claim 2, wherein the nodes are identified by applying a low-pass filter to the optimized reticle layout design.

6. The method of claim 5 further comprising the step of performing OPC optimization using the approximated IC layout design.

7. The method of claim 2, wherein the nodes are identified by measuring the gradient along each boundary such that a specified change in gradient indicates the presence of a node.

8. The method of claim 2 further comprising the step of performing OPC optimization using the approximated IC layout design.

9. The method of claim 1 further comprising the step of flagging the identified feature defects for later investigation.

10. The method of claim 9 further comprising the step of performing OPC optimization using the approximated IC layout design.

11. The method of claim 1 further comprising the step of performing OPC optimization using the approximated IC layout design.

12. The method of claim 1, further comprising the steps of:
    identifying regions in the IC layout design having different degrees of complexity; and
    performing the method steps of claim 1 on regions having a particular degree of complexity.

13. The method according to claim 12, wherein the particular degree of complexity falls within a range of complexity.

14. The method according to claim 13, wherein the regions having different degrees of complexity relate to memory functions and/or logic functions.

15. The method according to claim 13, wherein the identifying step further comprises determining the feature density of the IC layout design.

16. The method according to claim 12, wherein the regions having different degrees of complexity relate to memory functions and/or logic functions.

17. The method according to claim 16, wherein the identifying step further comprises determining the feature density of the IC layout design.

18. The method according to claim 12, wherein the identifying step further comprises determining the feature density of the IC layout design.

19. An apparatus for designing an integrated circuit comprising:
    means for performing inverse optical proximity correction (OPC) to generate an optimized reticle layout design from an IC layout design;
    a model describing an optical system for transferring the IC layout design onto a semiconductor wafer using a reticle, wherein the optimized reticle layout design comprises features defined by a plurality of boundaries;
    means for approximating the plurality of boundaries to generate an approximated reticle layout design suitable for the manufacture of the IC; and
    means for performing OPC simulation on at least a portion of the approximated reticle layout design.

* * * * *